(12) United States Patent
Nelson

(10) Patent No.: US 7,596,305 B2
(45) Date of Patent: Sep. 29, 2009

(54) METHOD AND APPARATUS FOR PREPARING VAPORIZED REACTANTS FOR CHEMICAL VAPOR DEPOSITION

(75) Inventor: Douglas M. Nelson, Curtice, OH (US)

(73) Assignee: Pilkington North America, Inc., Toledo, OH (US)

(*) Notice: Subject to any disclaimer, the term of this patent is extended or adjusted under 35 U.S.C. 154(b) by 0 days.

(21) Appl. No.: 10/948,902

(22) Filed: Sep. 24, 2004

(65) Prior Publication Data

US 2005/0066894 A1 Mar. 31, 2005

Related U.S. Application Data

(62) Division of application No. 10/376,894, filed on Feb. 28, 2003, now Pat. No. 6,827,974.

(60) Provisional application No. 60/369,110, filed on Mar. 29, 2002.

(51) Int. Cl.
*F22B 29/06* (2006.01)
*F22B 1/28* (2006.01)
*C23C 16/00* (2006.01)

(52) U.S. Cl. .................... 392/396; 392/400; 118/726

(58) Field of Classification Search ........... 392/396, 392/400; 366/273; 118/726
See application file for complete search history.

(56) References Cited

U.S. PATENT DOCUMENTS 3,554,497 A * 1/1971 Zipperer .................. 366/110

(Continued)

FOREIGN PATENT DOCUMENTS

JP 10-018041 * 1/1998

OTHER PUBLICATIONS

Random House Webster's Unabridged Dictionary 2nd Ed., Random House, 2001, pp. 440 and 572.*

(Continued)

*Primary Examiner*—Michael Cleveland
*Assistant Examiner*—Keath T Chen
(74) *Attorney, Agent, or Firm*—Marshall & Melhorn, LLC

(57) ABSTRACT

One or more coating precursors are selected from metal or silicon compounds at a temperature above their melting points but substantially below their standard vaporization temperature, thereby causing the coating precursors to be in the form of a liquid. A vaporization chamber has a structure for continually injecting the liquid coating precursor into the chamber to produce a vapor. A seal-less, magnetically driven portion rotates a structure for distributing the liquid coating precursor in the vaporization chamber. In one embodiment, a barrier gas is injected adjacent the chamber at a velocity greater than the diffusion velocity of the vapor to prevent the vapor from communicating with the magnetically driven portion. In another embodiment, a first portion of the magnetically driven portion is connected to a structure for distributing the liquid coating precursor in the vaporization chamber. The second portion, located adjacent the first portion, but outside the vaporization chamber, magnetically couples with and rotates the first portion.

22 Claims, 5 Drawing Sheets

U.S. PATENT DOCUMENTS

| | | | | |
|---|---|---|---|---|
| 3,795,386 | A | * | 3/1974 | Carter et al. ................ 366/76.1 |
| 3,932,068 | A | * | 1/1976 | Zimmermann ............... 417/420 |
| 5,324,540 | A | * | 6/1994 | Terada ..................... 427/255.5 |
| 5,564,907 | A | * | 10/1996 | Maruyama et al. .......... 417/252 |
| 5,776,255 | A | * | 7/1998 | Asaba et al. ................ 118/726 |
| 5,984,526 | A | * | 11/1999 | Imai et al. ................... 384/129 |
| 6,036,783 | A | * | 3/2000 | Fukunaga et al. ........... 118/724 |
| 6,039,808 | A | * | 3/2000 | Toyoda et al. ............... 118/715 |

OTHER PUBLICATIONS

McGraw-Hill Encyclopedia of Science and Technology, "Motor", pp. 440-450, 1992.*

* cited by examiner

METHOD AND APPARATUS FOR PREPARING VAPORIZED REACTANTS FOR CHEMICAL VAPOR DEPOSITION

CROSS REFERENCE TO RELATED APPLICATION

This application is a division of application Ser. No. 10/376,894 filed Feb. 28, 2003, now U.S. Pat. No. 6,827,974 which claims priority of U.S. provisional Application 60/369,110, filed on Mar. 29, 2002,which is hereby incorporated by reference in its entirety.

FIELD OF THE INVENTION

The present invention relates to a method and apparatus for preparing vaporized reactants, and more particularly, to a method and apparatus for preparing vaporized reactants for chemical vapor deposition with a magnetically driven, sealless motor. A gas may act as a barrier to prevent the vaporized reactants from communicating with other components of the vaporization apparatus.

BACKGROUND OF THE INVENTION

Typically, coated glass articles are produced by continuously coating a glass substrate while it is being manufactured in a process known in the art as the "float glass process." This process involves casting glass onto a molten tin bath which is suitably enclosed, then transferring the glass, after it has sufficiently cooled, to lift out rolls aligned with the bath, and finally cooling the glass as it is advanced across the rolls initially through a lehr and thereafter while exposed to the ambient atmosphere. A non-oxidizing atmosphere is maintained in the float portion of the process, while the glass is in contact with the molten tin bath, to prevent oxidation. An air atmosphere is maintained in the lehr. The chemical vapor deposition of various coatings may be conveniently performed in the bath or the lehr, or even in the transition zone therebetween.

The physical form of the reactants employed in glass coating processes is generally a gas, liquid, solid, vaporized liquid or solid, liquid or solid dispersed in a barrier gas mixture, or vaporized liquid or solid dispersed in a barrier gas mixture. The chemical vapor deposition process generally employs a vaporized liquid or solid, which is typically dispersed in a barrier gas mixture.

Chemical vapor deposition processes are well known in the art of coating glass substrates. For example, U.S. Pat. No. 5,090,985 discloses a method of preparing vaporized reactants by injecting a liquid coating precursor into a vaporization chamber and heating the precursor until it turns into a vapor. Simultaneously, a blend gas is admitted into the chamber and thoroughly mixed with the vapor. A set of mixing blades, in direct mechanical engagement with a motor, rotate inside the vaporization chamber and distribute the liquid precursor as a uniform, thin film onto the vaporization chamber walls. The vaporized precursor and blend gas mix and become a stream of vaporized reactants for pyrolytic decomposition at the surface of a hot substrate.

Typically, one or more seals are located between the motor and the vaporization chamber to prevent precursor vapor from reaching the motor. For example, at least one seal is typically located around the shaft connecting the mixing blades with the motor. The seals are designed to exude small amounts of oil. The oil, however, may mix with the precursor thereby contaminating the precursor. Also, the seals may fail due to dirt particles becoming located between the seal and the shaft. The particles cause the shaft and the seal to vibrate and the vibrations eventually cause the seal to weaken and fail. If a seal fails, large amounts of oil may leak into the vaporization chamber and/or precursor vapor may leak into the seal oil.

Magnetically driven motors are well known in the art for rotating an object without a direct mechanical connection between the motor and the object. Typically, the absence of a direct mechanical connection eliminates the need for drive shafts and seals around those shafts. For example, U.S. Pat. Nos. 4,790,911 and 4,913,777 disclose the use of a magnetically driven motor to rotate a container without a direct mechanical connection between the motor and the container.

U.S. Pat. No. 4,913,777 teaches a container having a closure with a driven magnet affixed thereto. A driving magnet is located outside the closure. Upon engagement of the driving magnet with the driven magnet, the closure is rotated thereby distributing solvent about the inside surface of the closure. The walls of the closure are heated resulting in the formation of a vapor of the solvent.

The rotation of the closure cannot, however, distribute a uniform, thin layer of precursor material on the entire inside surface of the closure. Additionally, the container of the '777 patent does not allow for the continuous and uniform addition of precursor and other gases into the closure typically required for chemical vapor deposition preparations.

It must be noted that the prior art referred to hereinabove has been collected and examined only in light of the present invention as a guide. It is not to be inferred that such diverse art would otherwise be assembled absent the motivation provided by the present invention.

Therefore, it would be desirable to have a magnetically driven means for mixing and consistently distributing the precursor material on the inside of the vaporization chamber. It would also be desirable to create a barrier between the corrosive vaporized reactants in the vaporization chamber and other components of the apparatus with a barrier gas.

SUMMARY OF THE INVENTION

The present invention is directed toward a method and apparatus for preparing vaporized reactants, useful, for example, for chemical vapor deposition onto hot substrates. In accordance with the present invention, it has been discovered that vaporized reactants can be prepared with:

1) one or more coating precursors wherein said precursors are metal or silicon compounds at a temperature above their melting points but substantially below their standard vaporization temperatures, thereby causing said coating precursors to be in the form of a liquid;

2) a magnetically driven portion having driver and driven magnets and a structure to align said magnets;

3) a vaporization chamber having at least one inlet for continually injecting said liquid coating precursors into said chamber to produce a vapor;

4) a barrier portion adjacent said magnetically driven portion having a gas located therein; and 5) a structure for distributing said liquid precursors in said chamber, said structure in communication with said magnetically driven portion through said barrier portion.

In an alternative embodiment, vaporized reactants can also be prepared with:

1) one or more coating precursors wherein said precursors are metal or silicon compounds at a temperature above their melting points but substantially below their standard vaporization temperatures, thereby causing the coating precursors to be in the form of a liquid;

2) a magnetically driven motor portion having driver and driven magnets and a structure to couple said magnets;

3) a vaporization chamber having at least one inlet for continually injecting said liquid coating precursors into said chamber to produce a vapor;

4) a structure for distributing said liquid coating precursors in said chamber, said structure in communication with said motor portion.

The present invention provides a substantially contaminant-free stream of a coating precursor vapor. Because there are no seals to fail, the likelihood of oil leaking into the vaporization chamber is eliminated as is the possibility of precursor vapors leaking into the seal oil.

BRIEF DESCRIPTION OF THE DRAWINGS

The above, as well as other advantages of the present invention, will become readily apparent to those skilled in the art from the following detailed description when considered in the light of the accompanying drawings in which.

DETAILED DESCRIPTION OF THE PREFERRED EMBODIMENTS

It is to be understood that the invention may assume various alternative orientations and step sequences, except where expressly specified to the contrary. It is also to be understood that the specific devices and processes illustrated in the attached drawings, and described in the following specification are simply exemplary embodiments of the inventive concepts defined in the appended claims. Hence, specific dimensions, directions or other physical characteristics relating to the embodiments disclosed are not to be considered as limiting, unless the claims expressly state otherwise.

Figure 1:
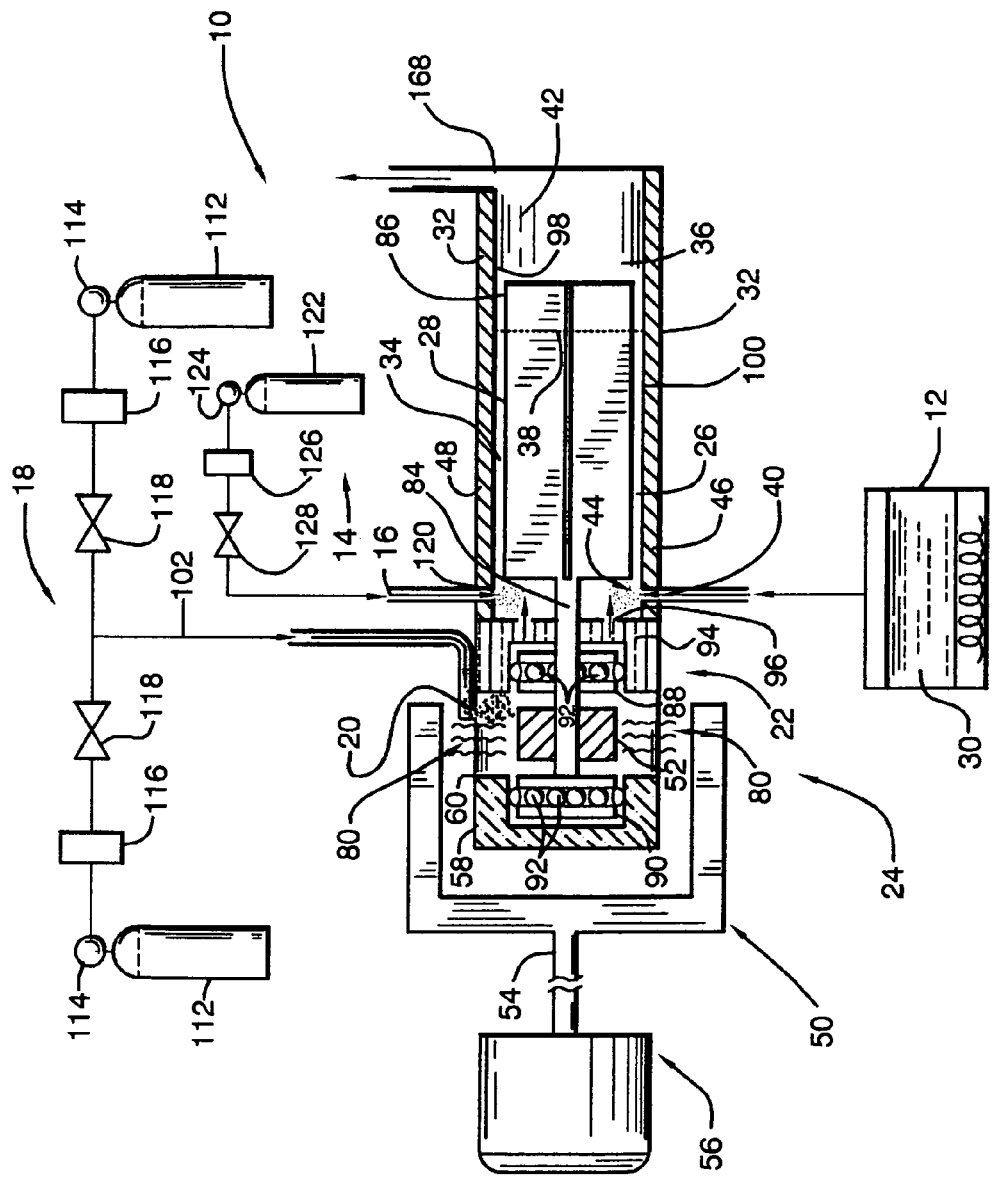
FIG. 1 is a schematic side view of the present invention, including a vertical cross-sectional view of a vaporization chamber and a magnetically driven portion.
Figure 2:
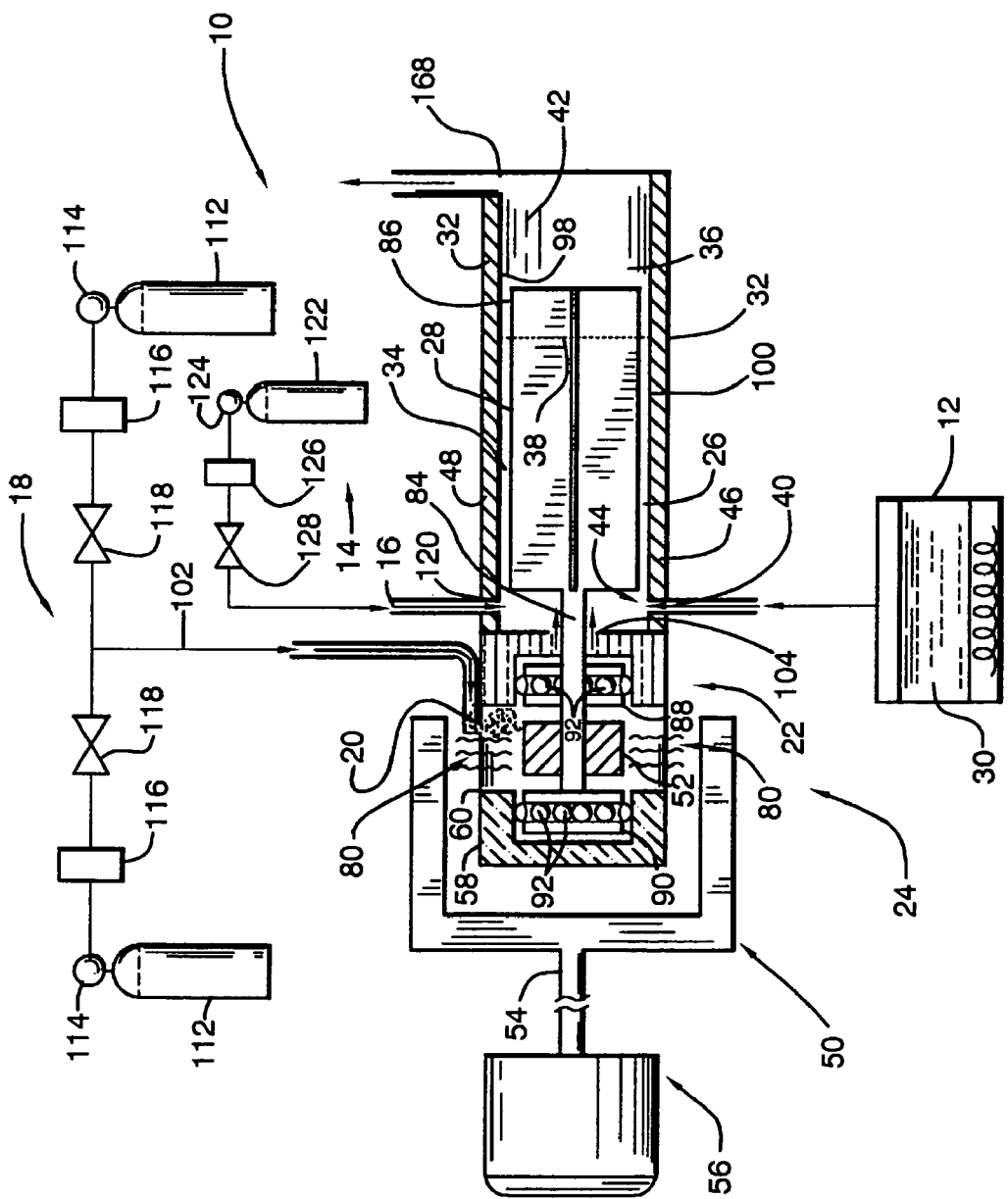
FIG. 2 is a schematic side view of an alternative embodiment of the present invention.

Referring now to FIGS. 1 and 2, an apparatus 10 for carrying out the invention is depicted having at least one preheating vessel 12, equipment illustrated generally at 14 for the introduction of a gas 16 into the apparatus 10, equipment illustrated generally at 18 for the introduction of a barrier gas 20 at least into a barrier portion 22, a seal-less, magnetically driven portion 24, a vaporization chamber 26, and a structure 28 for distributing a precursor material 30 uniformly within the vaporization chamber 22.

The vaporization chamber 26 is a vessel enclosed by one or more walls 32 and having a liquid zone 34 and a vapor zone 36. A horizontal thin film evaporator, such as for example by Artisan Industries, Inc., of Waltham, Mass., having the product designation "One-Half Square Foot Rototherm E," provides a suitable vaporization chamber 26 for the present invention. The boundary between the zones 34, 36 is indicated generally by line 38 in FIGS. 1 and 2. The liquid zone 34 is defined as the area within the vaporization chamber 26 in which the wall 32 of the vaporization chamber 26 is coated with a liquid coating precursor 40, while the vapor zone 36 is defined as the area within the vaporization chamber 26 where the liquid coating precursor 40 has been completely converted to a vapor 42. The location of the boundary 38 between the liquid zone 34 and the vapor zone 36 will vary depending on the volatility of the particular precursor material 30 being used, the vaporization chamber 26 temperature, mass flow rate of the barrier gas 20, etc. Thus, when using a precursor material 30 having a relatively high volatility, the vaporization chamber 26 will have a relatively large vapor zone 36.

The precursors materials 30 of the present invention are either liquids, which exert a vapor pressure at room temperature, or solids which, when heated above room temperature but below their standard vaporization temperatures, become liquids which exert a vapor pressure at those elevated temperatures. By "standard vaporization temperature" as used herein it is meant the temperature at which the vapor pressure of the pure liquid component is equal to one atmosphere. In either case, the precursor materials 30 in the present invention are initially heated in the preheating vessel 12 to temperatures above their melting points but substantially below their standard vaporization temperatures. Typically, the precursor materials 30 are preheated to a temperature from about 70° F. to 530° F. At such temperatures the precursor materials 30 become volatile liquids which are well below their decomposition temperatures. By the term "substantially below the standard vaporization temperature" as used herein it is meant a temperature which is from 10° to 90° F. below the standard vaporization temperature of a compound (the coating precursor), such that thermal decomposition of the heat sensitive compounds is greatly reduced.

A precursor material 30 may be initially heated by any conventional apparatus known in the art for heating solids or liquids, such as fired or electrical resistance heating or steam jacketing of the preheating vessel 12 containing the precursor material 30. Although only one heating apparatus is depicted in FIGS. 1 and 2, additional heating apparatuses for one or more precursor materials (not shown) may be added without departing from the scope of the invention. The liquid coating precursor 40 is communicated into the liquid zone 34 of the vaporization chamber 26 though at least one inlet 44. Preferably, the at least one inlet 44 is adjacent a bottom portion 46 of the vaporization chamber 26 and allows the liquid precursor 40 to be continuously and uniformly injected into the chamber 26, as depicted in FIGS. 1 and 2.

Suitable precursor materials 30 useful for practicing the present invention include, without limitation to those specifically recited, dimethyltin dichloride, tetraethoxysilane, diethyltin dichloride, dibutyltin diacetate, tetramethyl tin, methyltin trichloride, triethyltin chloride, trimethyltin chloride, tetrabutyl titanate, titanium tetrachloride, titanium tetraisopropoxide, triethylaluminum, diethylaluminum chloride, trimethylaluminum, aluminum acetylacetonate, aluminum ethylate, diethyldichlorosilane, methyltriethoxysilane, zinc acetylacetonate, zinc propionate, or mixtures thereof. These compounds are generally well known in the art of chemical vapor deposition (CVD) technology, as precursors for applying coatings on hot glass. The invention will work equally well for any precursor material 30, or mixtures thereof, that exert a vapor pressure. A preferred precursor material 30 for depositing tin oxide is dimethyltin dichloride, or a mixture of dimethyltin dichloride and methyltin trichloride, for example 95 weight percent dimethyl tin dichloride and 5 weight percent methyltin trichloride.

The vaporization chamber 26 is heated by conventional means such as, for example, fired or electrical resistance heating or steam jacketing 48. In this way, the temperature of the vaporization chamber 26 is constantly maintained, and the heat necessary for vaporization of the liquid precursor 40 is provided. Typically, the contents of the vaporization chamber 26 are maintained at a temperature from about 95° F. to 550° F.

The magnetically driven portion 24 has at least one driver magnet 50 and at least one driven magnet 52. The driver magnet 50 is connected to a motor shaft 54 which extends from a motor 56. FIGS. 1 and 2 only schematically depict that connection. In one preferred embodiment depicted in FIGS. 1 and 2, the driven magnet 52, is located radially inward from the driver magnet 50. The driven magnet 52 is completely sealed within a chamber 58 from the driver 50 and is connected to the structure 28 for distributing precursor material 30 uniformly within the vaporization chamber 26. The two magnets 50, 52 are coupled through one or more walls 60 of the chamber 58 such that upon rotation of the driver magnet 50, the driven magnet 52 and the structure 28 are turned without physical contact between the magnets 50, 52.

The shape, size and orientation of the driver 50 and driven 52 magnets are only schematically depicted in the Figures. Those skilled in the art understand that magnets of various shapes, sizes and orientations may be utilized without departing from the scope or spirit of the present invention.

Typically, the driver magnet 50 has one or more banks of high strength permanent magnets (not shown). The driven magnet 52 may have corresponding banks of similar magnets, which cause it to rotate in synchronization with the driver magnet 50. Alternatively, the driven magnet 52 may have an arrangement of copper bars, which cause it to follow the driver magnet 50 at a slightly lower speed.

Figure 3:
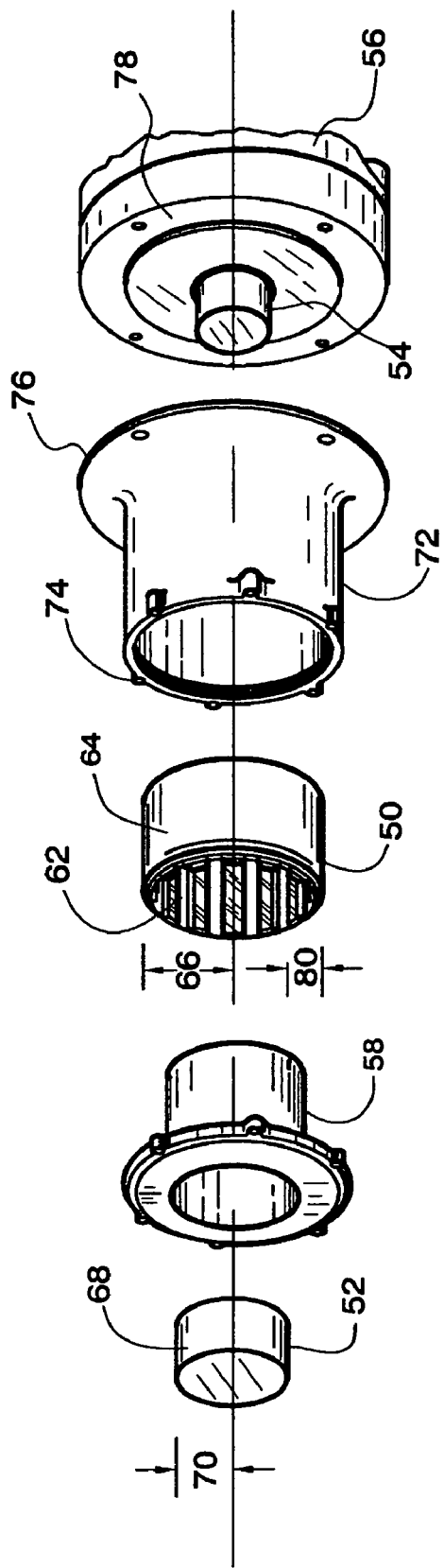
FIG. 3 is a schematic view of a structure to couple the driver and driven magnets of said magnetically driven portion.
Figure 4:
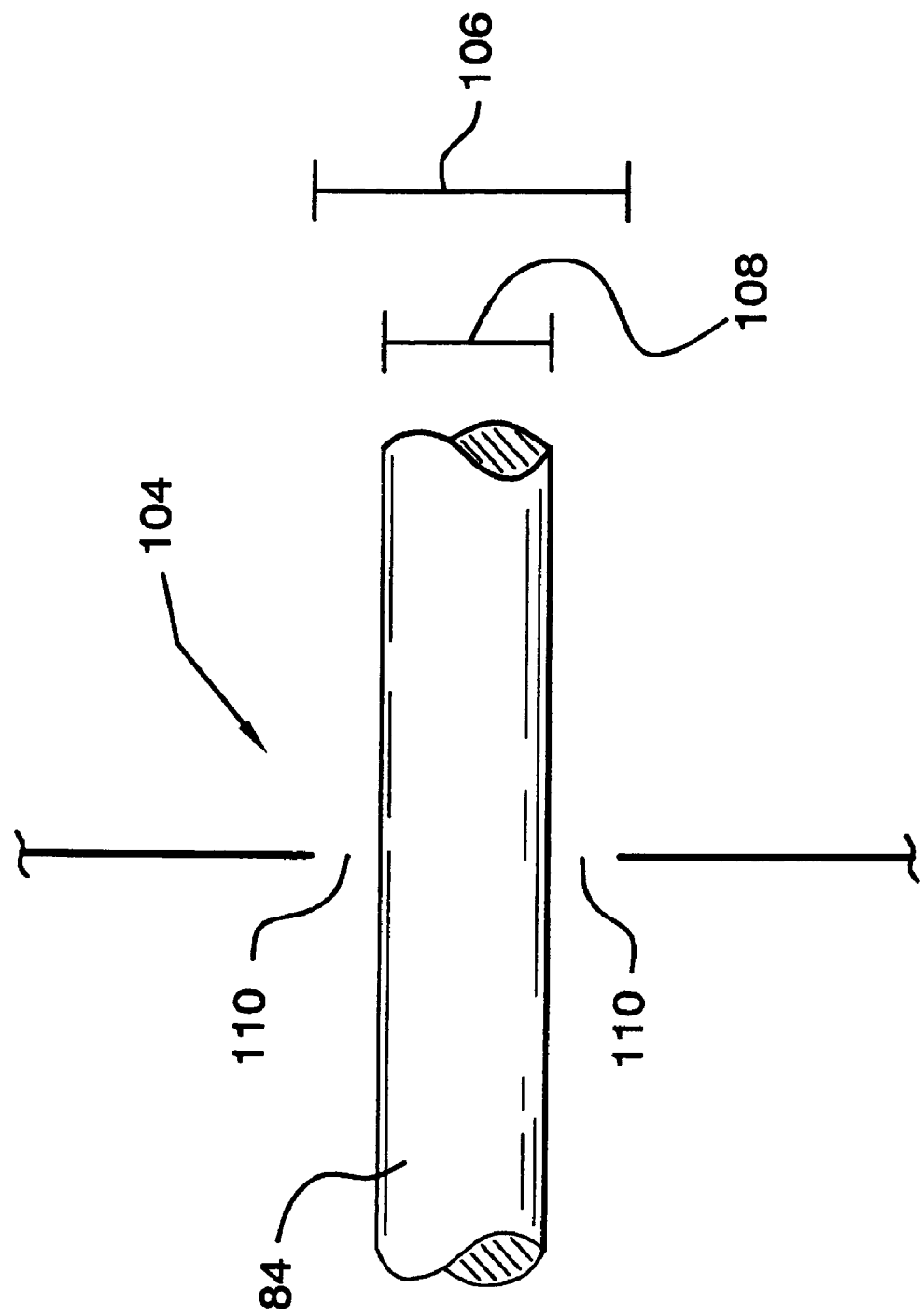
FIG. 4 is a schematic side view of a portion of a shaft passing through a chamber.

FIG. 3 schematically depicts a structure to precisely align the driver 50 and the driven 52 magnets shown in FIGS. 1 and 2. The driver 50 magnet has an inside surface 62 which has been machined precisely to the dimensions of the motor shaft 54. The driver magnet 50 also has an outside surface 64 which has been precisely machined to have a constant radius 66. Machining the inside 62 and outside 64 surfaces of the driver 50 magnet allows the magnet 50 to rotate at a constant radial distance 66 about the shaft 54. An outside surface 68 of the driven magnet 52 is also machined to have a constant radius 70.

A collar 72, having a first 74 and a second 76 machined surface, is also depicted in FIG. 3. The collar 72 fits over the driver 50 magnet and the second machined surface 76 is securely attached to an end plane 78 of the motor 56. The first machined surface 74 of the collar 72 is attached to the chamber 58 housing the driven 52 magnet. The driver 50 magnet rotates at a constant velocity at a constant radius 80 from the driven magnet 52, thereby allowing the magnets 50, 52 to engage through a uniform and constant magnetic field 82, as depicted in FIGS. 1 and 2. The uniform and constant magnetic field 80 between the magnets 50, 52 causes the driven magnet 52 to rotate constantly and uniformly. The constant and uniform rotation of the driven magnet 52 rotates the structure 28 for distributing liquid coating precursor 40, depicted for example in FIGS. 1 and 2, in the same manner resulting in a uniform and thin film of liquid coating precursor 40 being located on the walls 32 of the vaporization chamber 26.

As shown in FIGS. 1 and 2, the structure 28 for distributing precursor material within the vaporization chamber has a shaft 84 connected to the driven magnet 52. One or more mechanical wipers or blades 86 are connected to the shaft 84 and extend into the vaporization chamber 26 through the barrier portion 22. The shaft 84 is supported by at least one friction reducing device, such as a bearing ring 88. Preferably, the shaft 84 is supported by a first 88 and a second 90 bearing ring, as depicted in FIGS. 1 and 2. The bearing rings 88, 90 have a plurality of ball bearings 92 located therein and allow the shaft 84 to be rotatably supported within the vaporization chamber 26. At least the second bearing ring 90 is supported in place by a bearing ring support structure 94 having a plurality of ports 96.

The mixing shaft 84 preferably turns the mechanical wipers or blades 86 to uniformly propel the liquid coating precursor 40 with centrifugal force against an inner wall 98 of the vaporization chamber 26. The liquid coating precursor 40 forms a uniform layer 100 on the inner wall 98 where it vaporizes and produces a steady stream of concentrated precursor vapor 42.

As depicted in FIG. 1, the barrier gas 20 is communicated from the equipment 18 through at least one barrier gas line 102 into the chamber 58 of the driven magnet 52. The barrier gas 20 flows through the ports 96 within the bearing ring support structure 94. From the ports 96, the barrier gas 20 flows into the barrier portion 22. In the preferred embodiment, the barrier portion 22 includes the driven magnet chamber 58, at least the second bearing ring 90 and at least a portion of the vaporization chamber 26.

In an alternative embodiment, depicted in FIG. 2, the driven magnet chamber 58 has at least one aperture 104 substantially adjacent the shaft 84 which communicates the barrier gas 20 from the chamber 58 into the barrier portion 22. As depicted in FIG. 4, the aperture 104 has a slightly larger diameter 106 than an outside diameter 108 of the shaft 84. The shaft 84 is located through the aperture 104 thereby leaving a gap 110 around the shaft 84. The gap 110 allows the barrier gas 20 to flow from the chamber 58 and into the barrier portion 22.

Regardless of the means selected to communicate the barrier gas 20 from the chamber 58 into the barrier portion 22, both of the above described embodiments allows for the continuous and uniform addition of barrier gas 20 into the vaporization chamber 26.

Preferably, the barrier gas 20 is continuously communicated from the chamber 58 into the barrier portion 22 at a velocity which is greater than the diffusion velocity of the precursor vapor 42. Typically, the greater velocity of the barrier gas 20 is provided by pressurizing the barrier gas 20. The communication of a barrier gas 20 into the barrier portion 22 at a velocity greater than the diffusion velocity of the precursor vapor 42 prevents the precursor vapor 42 from communicating from the vaporization chamber 26 into the barrier portion 20. The greater velocity of the barrier gas 20 also prevents the corrosive precursor vapor 42 from reaching the bearing rings 88, 90 or the magnetically driven portion 24.

The barrier gas 20 may be, for example, helium, nitrogen, hydrogen or argon, mixtures thereof, or any other barrier gas 20 which is chemically inert with the precursor vapor 42 at the temperatures involved, as well as mixtures thereof. Preferred blends of gasses are helium and nitrogen, and mixtures thereof. The barrier gas 20 is stored in cylinders 112 and piped through regulators 114, flow meters 116 and valves 118 into the chamber 58, as shown in FIGS. 1 and 2.

The barrier gas 20 is communicated into the barrier portion 22 at a temperature below the ambient vaporization chamber temperature. Means (not shown) to modify the delivery temperature of the barrier gas 20 injected into the barrier portion 22 may be used. The lower temperature of the barrier gas 20 cools the bearing rings 88, 90 and prevents, or greatly reduces, the decomposition of the rings 88, 90 as a result of heat.

If desired, any amount of the gas 16 may be communicated into the liquid zone 34 of the vaporization chamber 26 through at least one inlet 120 in the vaporization chamber 26. The gas 16 increases the mass transfer of the precursor vapor 42 from the vaporization chamber 26. This increase in mass transfer of precursor vapor 42 causes accelerated vaporization of the liquid precursor 40.

The gas 16 injected into the liquid zone 34 may be the same as the barrier gas 20 discussed above or it may be helium, nitrogen, hydrogen, argon, mixtures thereof or any other chemically inert gas. The gas 16 to be injected into the liquid zone 34 is stored in cylinders 122 and piped through regulators 124, flow meters 126 and valves 128. Means (not shown) to modify the delivery temperature of the gas 16 injected into the vaporization chamber 26 may be used.

Figure 5:
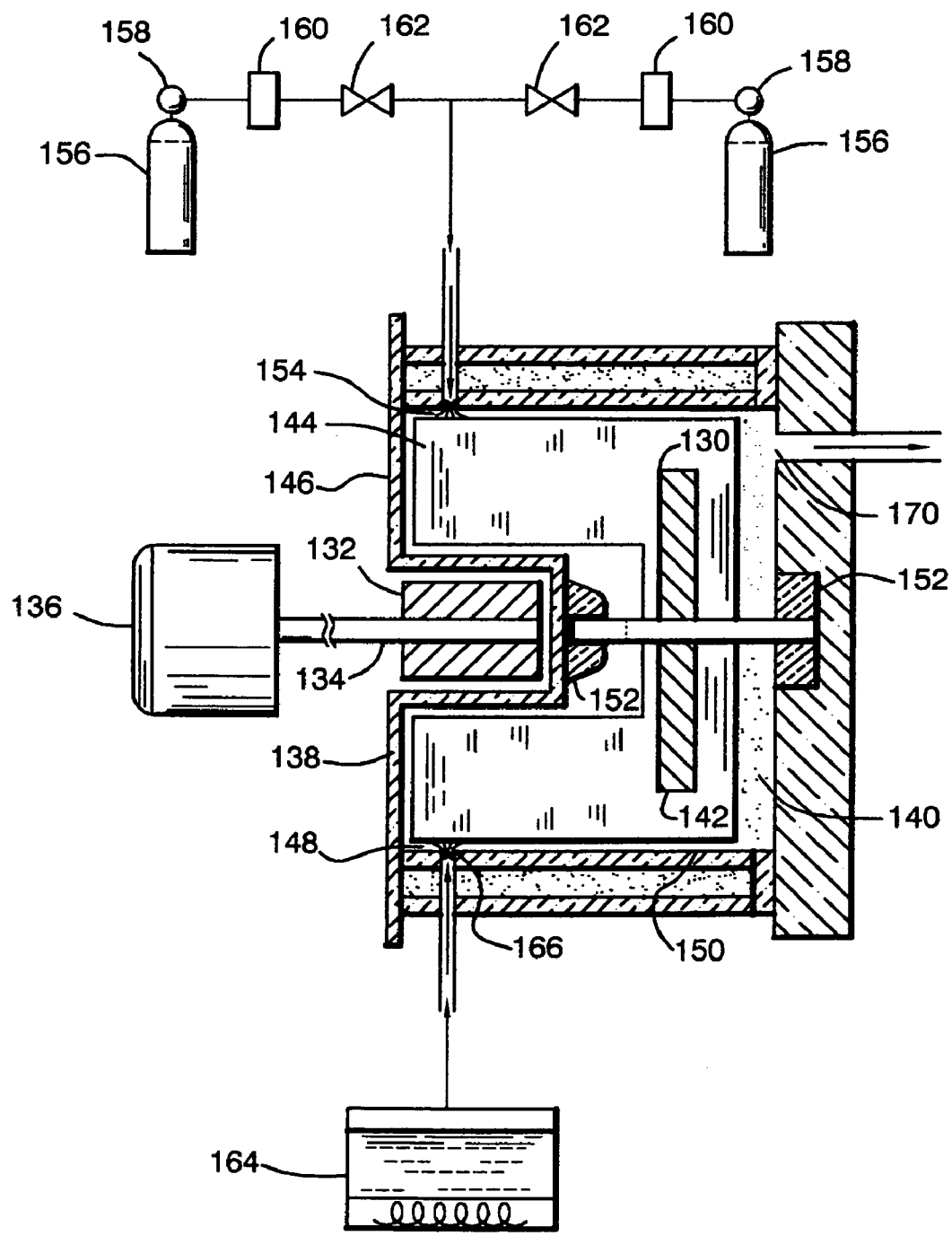
FIG. 5 is a schematic cross-sectional side view depicting an alternative embodiment of the present invention.

An alternative embodiment of the present invention is depicted in FIG. 5. FIG. 5 depicts a driven magnet 130 adjacent a driver magnet 132. The driver magnet 132 is connected by a shaft 134 to a rotating motor 136. The driven magnet 130 is located within a vaporization chamber 138 that separates the driver magnet 132 from the driven magnet 130 yet allows them to magnetically couple. The chamber 138 prevents precursor vapor 140 from communicating with the motor 136. Preferably, the driven magnet 130 is selected to withstand the high temperatures associated with the vaporization chamber 138. For example, a driven magnet 130 having a temperature and chemical resistant resin coating 142, such as those known to those skilled in the art, may be used. The driver 132 and driven magnets 130 and the vaporization chamber 138 are designed and operate substantially as described above.

The driven magnet 130 is formed with one or more wipers or blades 144 as depicted in FIG. 5. Upon the coupling of the driver magnet 132 with the driven magnet 130 through one or more walls 146 of the vaporization chamber 138, rotation of the driver magnet 132 rotates the driven magnet 130. Rotation of the driven magnet 130 turns the wipers or blades 144 inside the vaporization chamber 138 to uniformly propel liquid precursor 148 with centrifugal force against an inner wall 150 of the vaporization chamber 138.

The blade 144 is rotatably supported by at least two friction reducing devices within the vaporization chamber 138. Preferably, the friction reducing devices are temperature and chemically resistant bushings, or bearings 152. The bushings 152 may be constructed out of, for example, carbon or Teflon®, or other materials known to those skilled in the art for their chemical and temperature resistance.

If desired, a barrier gas 154 is communicated from cylinders 156, regulators 158, flow meters 160 and valves 162, substantially as described above, into the vaporization chamber 138 to increase the mass transfer of the coating precursor vapors 140 from the vaporization chamber 138. A precursor material 164 is initially heated, as described above, and communicated as a liquid into the vaporization chamber 138 through at least one inlet 166.

In both of the above described embodiments, the liquid precursor 40, 148, coating precursor vapor 42, 140, and barrier gas 20, 154 (if present) are heated inside the vaporization chamber 26, 138 to a temperature greater than the temperature of the injected liquid precursor 40, 148 but still below the coating precursor standard vaporization temperature. The temperature to which the components are heated will be determined by the thermal decomposition characteristics of the particular coating precursor used and the mass flow rate of the chosen barrier gas 20, 154. The liquid precursor 40, 148 and chemical composition of the barrier gas 20, 154 as well as their respective rates of introduction into the vaporization chamber 26, 124 must be selected together, such that a sufficient amount of barrier gas 20, 154 is present to cause an increase in the mass transfer of the vaporized precursor 42, 140 thereby accelerating the vaporization of the liquid precursor 40, 148. In this manner, the liquid precursor 40, 148 is completely vaporized at a temperature below its standard vaporization temperature.

The present invention is conducted in a continuous fashion, such that a stream of the vapor precursor 42, 140 and the barrier gas 20, 154 mixture is continually produced having a uniform, high concentration of vapor precursor 42, 140. In each of the above-described embodiments, the stream is caused to flow from the vaporization chamber 26, 138 through an outlet 168, 170 to a conduit (not shown) to the surface of the hot substrate (not shown) by means of pressure generated by the vaporization of the liquid precursor 40, 148 injected through the inlet 44, 166 and by the introduction of the pressurized barrier gas 20, 140 into the vaporization chamber 26, 138.

Most coating precursors, when vaporized, are extremely flammable under oxidizing conditions, and therefore can only be conveyed to the reaction site in a barrier gas stream at a concentration of a few gas phase percent. Higher concentrations of coating precursor vapor will ignite when contacted with the surface of the hot substrate in an oxidizing atmosphere. Therefore, the coating operation must be conducted utilizing a vaporized coating precursor stream having a concentration below the flammability limit for that particular coating precursor.

Coatings may be deposited onto the surface of a hot glass substrate by chemical vapor deposition (not shown). This process is typically conducted during the manufacture of glass by the float glass process, and may occur in the float bath where the glass ribbon is typically at a temperature in the range of about 1100° F. to about 1250° F., the lehr (glass temperatures of about 750° F. to about 1050° F.), or in the transition zone between the bath and the lehr (glass temperatures of about 1025° F. to about 1100° F.). Coating precursors are vaporized and conveyed to a point at or near the surface of the advancing glass ribbon. In the presence of oxygen, the coating precursors pyrolytically decompose to form an oxide coating on the surface of the glass. However, the invention is not limited to the deposition of oxide coatings, but can also be used when depositing non-oxide coatings such as silicon or transition metal nitrides. In addition, the invention can be used for chemical vapor deposition on any substrate, and is not limited to deposition on glass.

It must be noted that the process conditions are not sharply critical for the successful preparation of vaporized reactants according to the present invention. The process conditions described hereinabove are generally disclosed in terms which are conventional to the practice of this invention. Occasionally, however, the process conditions as described may not be precisely applicable for each compound included within the disclosed scope. Those compounds for which this occurs will be readily recognizable by those ordinarily skilled in the art. In such cases, the process may be successfully performed by conventional modifications known to those ordinarily skilled in the art, e.g., increasing or decreasing temperature conditions, varying the rates of introduction of the coating precursor or blend gas, changing to alternative CVD reactants or barrier gases, routine modifications of the vaporization process conditions, etc.

In accordance with the provisions of the patent statutes, the present invention has been described in what is considered to represent its preferred embodiments. However, it should be noted that the invention can be practiced otherwise than as specifically illustrated and described without departing from its spirit or scope.

What is claimed is:

1. An apparatus for preparing vaporized reactants, comprising:

at least one coating precursor wherein said precursor is a metal or silicon compound at a temperature above its melting point but substantially below its standard vaporization temperature, thereby causing said coating precursor to be in the form of a liquid;

a magnetically driven portion having at least one driver magnet connected to a motor shaft for rotation and at least one driven magnet connected to a mixing shaft for rotation of the mixing shaft about a horizontally oriented axis in response to the rotation of the at least one driver magnet, and a structure to align the at least one driver magnet and the at least one driven magnet, said driven magnet being located in a magnet chamber, said magnet chamber separating said driver magnet from said driven magnet;

a horizontally oriented vaporization chamber having a first inlet through which said liquid coating precursor is continually injected into said chamber thereby producing a vapor, and a second inlet through which an inert gas is injected causing an increase in the mass transfer of the vapor from the vaporization chamber;

a barrier portion separating said vaporization chamber from said magnetically driven portion, said barrier portion having a distinct barrier gas continuously injected therein, said barrier gas being injected into said magnet chamber to flow past said driven magnet and into said vaporization chamber to prevent said vapor from contacting said driven magnet;

a rotating structure comprising one or more mechanical wipers or blades connected to the mixing shaft for uniformly propelling said liquid coating precursor against an inner wall of said vaporization chamber, said structure in communication with said magnetically driven portion through said barrier portion so as to provide a continuous stream of vaporized reactant.

2. The apparatus of claim 1, wherein said velocity of said barrier gas prevents said precursor vapor from communicating into said barrier portion.

3. The apparatus of claim 1, wherein said velocity of said barrier gas prevents said precursor vapor from communicating into said magnetically driven portion.

4. The apparatus of claim 1, wherein said vaporization chamber is a thin film evaporator.

5. The apparatus of claim 1, wherein said vaporization chamber has a liquid zone and a vapor zone.

6. The apparatus of claim 1, wherein said driven magnet is connected to said structure for distributing said liquid coating precursors in said vaporization chamber.

7. The apparatus of claim 6, wherein said driver magnet is magnetically coupled with said driven magnet.

8. The apparatus of claim 7, wherein said driver magnet has an inside surface machined to accept a rotatable motor shaft.

9. The apparatus of claim 8, wherein said driver magnet has an outside surface machined to a constant radius.

10. The apparatus of claim 7, wherein a collar aligns said driver and said driven magnets.

11. The apparatus of claim 1, wherein said mixing shaft extends through said barrier portion and into said vaporization chamber.

12. The apparatus of claim 11, wherein said mixing shaft is supported by at least one friction reducing device.

13. The apparatus of claim 12, wherein said barrier gas located in said barrier portion cools said at least one friction reducing device.

14. The apparatus of claim 1, wherein said at least one wiper or blade distributes a substantially uniform thin layer of liquid coating precursors on an inner wall of said vaporization chamber.

15. The apparatus of claim 14, wherein said uniform thin layer of liquid coating precursors is communicated from said at least one blade to said vaporization chamber wall by centrifugal force.

16. The apparatus of claim 1, wherein said magnetically driven portion has a shaft aperture for allowing said mixing shaft to pass through.

17. The apparatus of claim 16, wherein said barrier gas communicates though said shaft aperture for said mixing shaft into said barrier portion.

18. The apparatus of claim 1, wherein said magnetically driven portion has one or more ports for allowing said barrier gas to communicate into said barrier portion.

19. The apparatus of claim 1, wherein said barrier gas is selected from the group consisting of helium, nitrogen, hydrogen, argon and mixtures thereof.

20. The apparatus of claim 19, wherein said barrier gas is a mixture of helium and nitrogen.

21. The apparatus of claim 1, wherein said vaporization chamber has at least one outlet for allowing said precursor vapor and said barrier gas to leave said chamber.

22. The apparatus of claim 21, wherein said first inlet is adjacent a bottom portion of said vaporization chamber and below said outlet.

* * * * *